US006537882B1

(12) United States Patent
Fujii

(10) Patent No.: US 6,537,882 B1
(45) Date of Patent: *Mar. 25, 2003

(54) METHOD OF FABRICATING A SEMICONDUCTOR DEVICE IN WHICH NO SIDE WALLS ARE FORMED ADJACENT THE GATES OF THE MOSFETS OF THE MEMORY CELL

(75) Inventor: Takeo Fujii, Tokyo (JP)

(73) Assignees: NEC Corporation, Tokyo (JP); NEC Electronic Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/911,770

(22) Filed: Aug. 15, 1997

(30) Foreign Application Priority Data

Aug. 15, 1996 (JP) ............................................... 8-215645

(51) Int. Cl.$^7$ .................. H01L 21/8239; H01L 21/8242

(52) U.S. Cl. ...................... 438/275; 438/279; 438/305; 438/210; 438/241

(58) Field of Search ................................. 257/296, 314, 257/392, 368, 300; 438/279, 283, 294, 299, 197, 199, 229, 303, 305, 306, 307, 587, 595, 210, 396, 241, 253, 275, 231

(56) References Cited

U.S. PATENT DOCUMENTS

| | | | |
|---|---|---|---|
| 4,775,642 A | * 10/1988 | Chang et al. ................ 438/258 |
| 5,021,353 A | * 6/1991 | Lowrey et al. | |
| 5,023,190 A | * 6/1991 | Lee et al. | |
| 5,026,657 A | * 6/1991 | Lee et al. | |
| 5,030,585 A | * 7/1991 | Gonzalez et al. | |
| 5,032,530 A | * 7/1991 | Lowrey et al. | |
| 5,252,504 A | 10/1993 | Lowrey et al. | |
| 5,323,343 A | * 6/1994 | Ogoh et al. .................. 257/306 |
| 5,449,634 A | * 9/1995 | Inoue .......................... 438/275 |
| 5,489,546 A | * 2/1996 | Ahmad et al. | |
| 5,595,922 A | * 1/1997 | Tigelaar et al. .............. 438/587 |
| 5,610,092 A | * 3/1997 | Tasaka ........................... 438/48 |
| 5,753,553 A | * 5/1998 | Hikawa et al. .............. 438/278 |
| 5,856,219 A | * 1/1999 | Naito et al. .................. 438/241 |

FOREIGN PATENT DOCUMENTS

| | | |
|---|---|---|
| JP | 5-90537 | 4/1993 |
| JP | 5-259400 | 8/1993 |
| JP | 7-169849 | 7/1995 |
| JP | 9-260607 | 10/1997 |

* cited by examiner

Primary Examiner—Mary Wilczewski
(74) Attorney, Agent, or Firm—Katten Muchin Zavis Rosenman

(57) ABSTRACT

The present invention relates to a semiconductor device comprising a first MISFET group and a second MISFET group each formed on a semiconductor substrate. Upon fabrication of it, an MOSFET constituting a memory cell and an MOSFET constituting a peripheral circuit are not formed in the same step. When a side wall is formed on each side of a gate electrode of the MOSFET constituting the peripheral circuit, the memory cell region is covered and protected with a layer which is to be a gate electrode. The semiconductor device thus fabricated has no side walls in the MOSFET constituting a memory cell.

According to the present invention, a semiconductor device of high reliability can be fabricated by forming one MOSFET free of side walls. Upon fabrication, it is possible to easily control the size or etching of the device, thereby widening the fabrication range.

5 Claims, 4 Drawing Sheets

METHOD OF FABRICATING A SEMICONDUCTOR DEVICE IN WHICH NO SIDE WALLS ARE FORMED ADJACENT THE GATES OF THE MOSFETS OF THE MEMORY CELL

BACKGROUND OF THE INVENTION

1. Field of the Invention

This invention relates to a semiconductor device, particularly, an MOS type IC and also to a fabrication process thereof.

2. Description of the Related Art

A semiconductor device generally has a regularly arranged area with a markedly high density and a randomly arranged area with a relatively wide pattern width and distance. A semiconductor memory can be given as one typical example of it. The regularly arranged memory cell region of such a semiconductor memory tends to contain a conductor layer which does not exist in the other regions, leading to a large unevenness on the wafer. This unevenness causes various disturbances in the light-exposure etching step which is indispensable for the fabrication of a semiconductor device, thereby forming a barrier to the miniaturization promotion.

One conventional example of an MOS memory will hereinafter be described with reference to the drawings.

FIGS. 2(a) to (f) illustrate an MOSDRAM formed on a P-type substrate 201. They indicate the fabrication process of a transistor structure until its completion with attention being paid to an N-channel type MOSFET in a memory cell region and an N-channel type MOSFET in a peripheral circuit region. There are products having a P-channel type MOSFET or a bipolar device in the peripheral circuit region but here, such products are omitted for the sake of clear technical explanation. Incidentally, it is easy to incorporate such devices on the same semiconductor device. In Japanese Patent Application Laid-Open No. 259400/1993, specifically described is a process for the fabrication of a DRAM having a CMOS circuit in the peripheral circuit region.

On the P-type semiconductor substrate 201, a thick silicon oxide film is selectively formed as a field insulation layer 202 in an element isolation region by the LOCOS method using a silicon nitride film as an oxidation resistant layer. An appropriate treatment is then given to the active region, whereby a gate insulation layer 203 is formed, for example, to a thickness of 100 Å. All over the surface, a polycrystalline silicon layer 204 which is to be a gate electrode is allowed to grow to a thickness of 2000 Å by the CVD method [FIG. 2(a)]. At this time, a channel stopper highly-concentrated P$^+$ region, which is not illustrated, is formed in advance directly beneath the field insulation layer 202.

A photoresist 205 is then formed by the light exposure method, whereby a gate electrode 204a is formed. At this time, it is the common practice to carry out simultaneous formation of an N-channel type transistor constituting a memory cell and an N-channel type transistor in the peripheral circuit region [FIG. 2(b)], which is presumed to be conducted in order to avoid an increase in the trend control parameters in the fabrication site. Subsequent to the removal of the photoresist 205, about 2×10$^{13}$ cm$^{-2}$ of phosphorus is introduced into the substrate 201 in a self-alignment manner by the ion implantation method with the gate electrode 204a and field insulation layer 202 as masks, whereby an n$^-$ (lightly doped) impurity diffusion layer 206 is formed [FIG. 2(c)].

All over the surface, a silicon oxide film of about 1500 Å, for example, is allowed to grow by the CVD method as an insulation layer 207 for the formation of side walls [FIG. 2(d)].

The insulation layer 207 for the formation of side walls is then etched using an anisotropic etching technique, whereby silicon oxide side walls 207 are formed on both sides of each gate electrode as shown in FIG. 2(e).

The memory cell transistor is then covered with a photoresist 209 by the light-exposure method known to date and about 3×10$^{15}$ cm$^{-2}$ of As is introduced into the source and drain regions of the N-channel MOSFET in the peripheral circuit region, whereby an n$^+$ impurity diffusion layer 208 is formed [FIG. 2(f)].

In the above-described manner, an N-channel type MOSFET constituting a memory cell and an N-channel type MOSFET constituting a peripheral circuit are formed. The MOSFET of the peripheral circuit is formed as a so-called LDD transistor having side walls of an oxide film, while that of the memory cell is formed as a single-drain type MOSFET constituted by an n$^-$ impurity diffusion layer.

Through a memory-cell-structure formation step subsequent to the above steps, a memory cell portion having the structure as shown in FIG. 3 is completed. In FIG. 3, indicated at the numerals 301, 302, 304, 306, 307 and 310 are a P-type semiconductor substrate, a field insulation layer, a gate electrode (word line), an n$^-$ impurity diffusion layer, a side wall and an n$^+$ impurity diffusion layer, respectively.

At the opening portions formed on the intrastratum insulation layer on the n$^-$ source and drain regions of the memory cell transistor formed in the step as shown in FIG. 2(f), polycrystalline silicon plugs 311 and 313 are formed and one of them is connected with a tungsten silicide interconnection 312 which is to be a bit line and the other one is connected with a polycrystalline silicon electrode 314 which is to be one electrode of a memory cell capacitor.

In addition, on the surface of the polycrystalline silicon electrode 314, a capacitive insulation layer 315 composed of a silicon oxide film and a silicon nitride film is formed, over which a capacitive polycrystalline silicon electrode 316 is formed as the other electrode of the memory cell capacitor, whereby a memory cell is completed. As needed, an intrastratum insulation layer, contact opening, metal interconnection layer are formed in this order by the method known to date, followed by the formation of a passivation layer, whereby the final structure is completed.

FIG. 4 is an equivalent circuit corresponding to the structure illustrated in FIG. 3. The N-channel type MOSFET constituting a memory cell is formed as a single drain type MOSFET constituted by an n impurity diffusion layer presumably because of the following three reasons: (1) to avoid the influence of crystal defects appearing as a result of the high-concentration ion implantation, (2) to avoid an increase in the leakage current occurring in the region where the heavily-doped impurity diffusion layer is in contact with the channel stopper impurity diffusion layer, and (3) to avoid an increase in the leakage current caused by a punch through between contiguous cells. It becomes very important to satisfy the above three points with the progress of the miniaturization.

Thus, the description has so far been made of, focusing on the process for the fabrication of MOSDRAM. Such a method is however accompanied with the problems because a difference in the density of the patterns between the memory cell region and the peripheral circuit region becomes large and at the same time, the miniaturization in the memory cell region has been drastically accelerated.

In a 64 MDRAM, for example, the gate pitch at the memory cell region reaches about 0.8 μm, while that at the peripheral circuit region remains only 2 to 3 μm. Also in the element isolation region, the memory cell region is formed of maximum density patterns of about 0.3 μm, while the peripheral circuit region is an assembly of rectangles as large as about several tens μm.

In the first place, a serious problem in the light exposure method has been actualized under such situations. Described specifically, it has come to be difficult to conduct size control in the memory cell region and peripheral circuit region, particularly when the size of the memory cell approaches to the resolution limit.

The size control is difficult in both the field formation step and gate formation step and that in the gate formation step is particularly difficult because of the influence of the denseness or sparseness of the underlayer. This is presumed to be caused mainly by the difference in the film thickness of a resist between regions. Relationship among the resist thickness, light exposure amount and finished size becomes complicated by the effects of the standing wave so that the finished size does not simply reflect a change in the other two factors, which leads to increased difficulty in the control.

In the second place, the problem of the conventional device resides in the control of uniformity in dry etching. The influence of the denseness or sparseness of patterns is well known as micro loading effects. The difference in the etching rate between the memory cell region and the peripheral circuit region becomes a problem in various steps and it becomes more apparent owing to an increase in the diameter of the wafer. For example, when in the memory cell region, a gate electrode is formed into an appropriate shape by completely removing the etching remnant, a substrate tends to be damaged at the peripheral portion of the electrode, which has a close relationship with a thinning tendency of a gate insulation film. In addition, when the insulation layer 207 for the formation of side walls as illustrated in FIG. 2(*d*) is subjected to anisotropic etching, etching sometimes extends to the surface of the substrate, which involves a problem.

This problem is actualized in the case where as described above, the source and drain regions of the MOSFET constituting the memory cell region are formed of n⁻ impurity diffusion layer, which will be described below with reference to FIG. 5. FIG. 5 is a cross-sectional view illustrating the memory cell portion at the time when the anisotropic etching of the insulation film for side-wall formation is completed. Indicated at the numerals 501, 502, 504, 506 and 507 are a P-type semiconductor substrate, a field insulation layer, gate insulation layer, n⁻ impurity diffusion layer and a side wall, respectively.

In FIG. 5, the source and drain regions have been dug and the surface portion of the n⁻ impurity diffusion layer 506 has been removed. As a result, the n⁻ impurity diffusion layer 506 lacks a relatively heavily-doped portion, leading to an electric situation where the resistance is high and scatters much. There happens a case where current conduction is not provided, though depending on the degree of the scattering. Moreover, owing to the damage of dry etching, defects appear in the n⁻ impurity diffusion layer 506, which becomes a cause for leakage current and is moreover presumed to bring about incomplete bonding. Such a tendency is considered to be eminent particularly in the end portion contiguous to the LOCOS silicon oxide.

In addition, a decrease in the film thickness of the end portion of the field insulation layer 502 as illustrated in FIG. 5 also leads to a reduction in the isolation capacity of the memory cell portion which is originally critical.

SUMMARY OF THE INVENTION

An object of the present invention is to provide a semiconductor device of high reliability. Another object of the present invention is to provide a fabrication process permitting easy control of size and etching and also permitting the widening of the fabrication range.

In the present invention, there is thus provided a semiconductor device which comprises a first MOSFET group of one conductivity type and a second MOSFET group of one conductivity type, each formed on a semiconductor substrate, said first MOSFET group having a side-wall insulation layer on each side of the gate electrode of said first MOSFET group and said second MOSFET group not having a side-wall insulation layer on either side of the gate electrode of said second MOSFET group.

Such a semiconductor device can be fabricated by a process which comprises successively forming a gate insulation layer and a gate conductive layer in an active region on the surface of one conductivity type semiconductor substrate; selectively removing said gate conductive layer to form a gate electrode for the first MOSFET group of one conductivity type while leaving the gate conductive layer portion corresponding to the second MOSFET group of one conductivity type; forming an insulation layer for the formation of side walls on the whole surface and then carrying out etching back to form a side wall on each side of said gate electrode; and selectively removing the remaining gate conductive layer portion to form a gate electrode for the second MOSFET group of one conductivity type.

According to the present invention, a semiconductor device of high reliability can be fabricated by forming a side-wall free MOSFET.

In the fabrication process according to the present invention, pattern formation is carried out separately in a dense region such as memory cell and a sparse region such as peripheral circuit so that it is possible to control the size or etching easily and to widen the fabrication range.

BRIEF DESCRIPTION OF THE PREFERRED EMBODIMENTS

A description will next be made of examples of the present invention concerning the fabrication of MOSDRAM as described above. It should be noted that as described above, the present invention does not intend to eliminate the incorporation of a P-channel type MOSFET or a bipolar device in the peripheral circuit region.

Figure 1A:
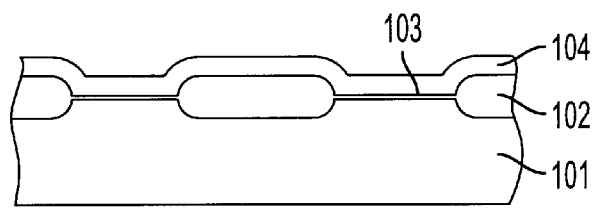
FIG. 1 is a cross-sectional view illustrating each step for the fabrication process of a semiconductor device of the present invention.
Figure 1B:
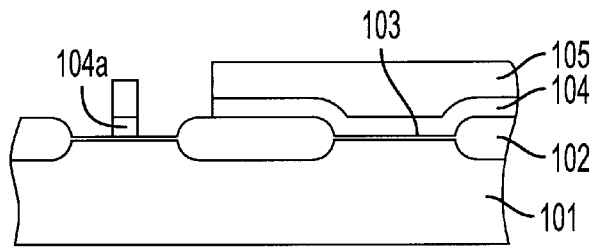
Figure 1C:
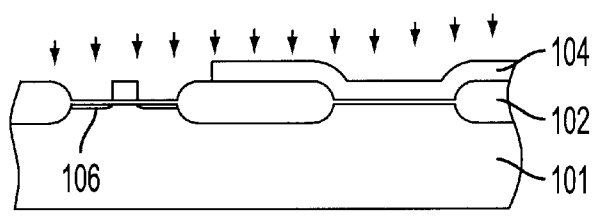
Figure 2A:
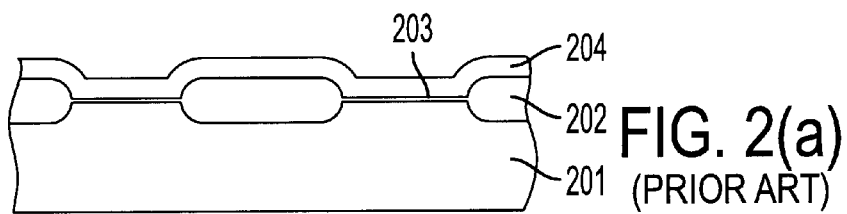
FIG. 2 is a cross-sectional view illustrating each step for the fabrication process of a conventional semiconductor device.
Figure 2B:
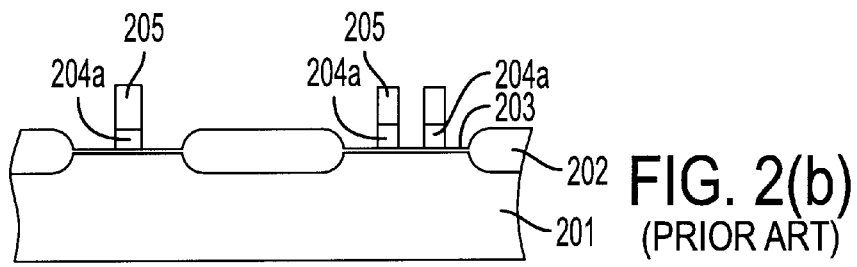
Figure 2C:
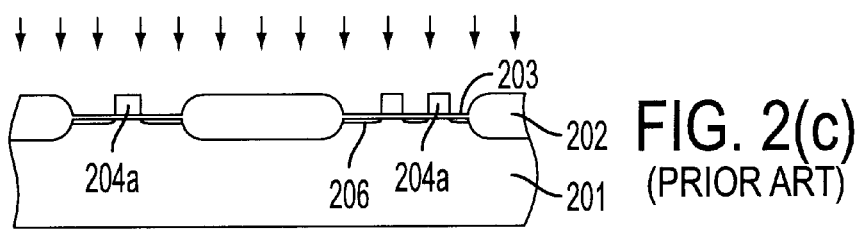
Figure 2D:
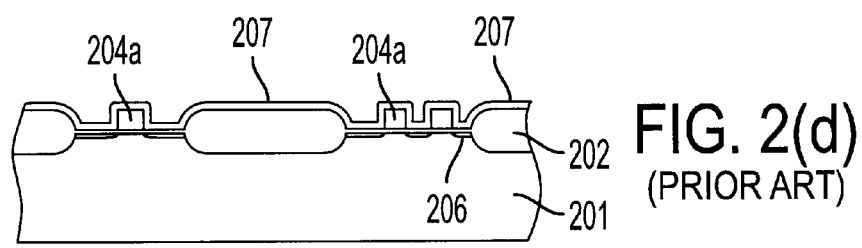
Figure 2E:
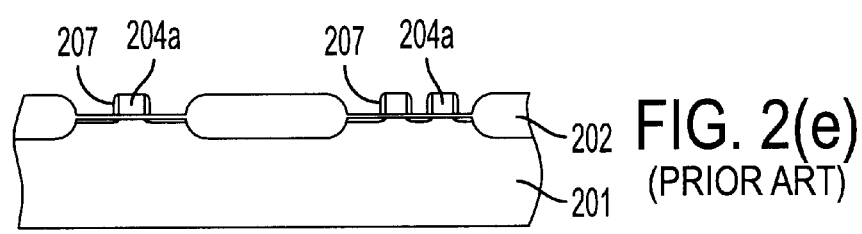
Figure 2F:
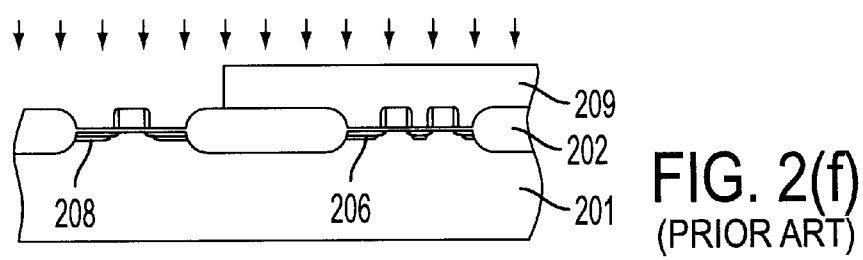
Figure 3:
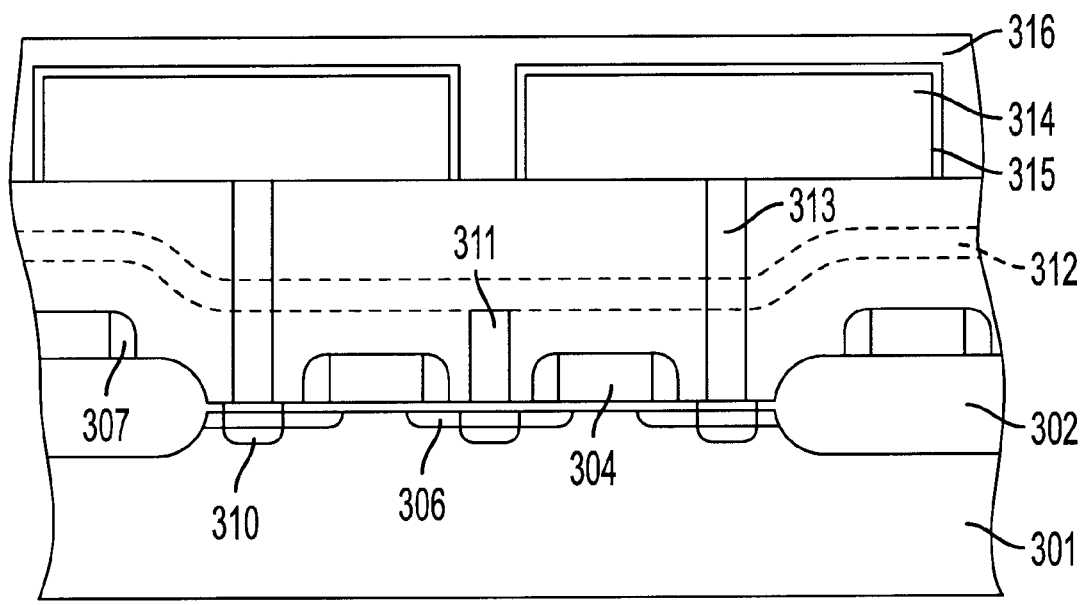
FIG. 3 is a cross-sectional view illustrating a memory cell portion formed according to the conventional fabrication process.
Figure 4:
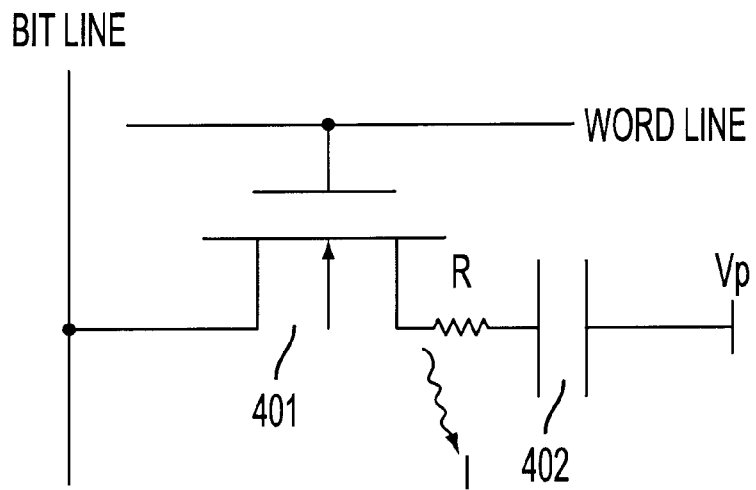
FIG. 4 illustrates an equivalent circuit (for one bit) corresponding to FIG. 3.
Figure 5:
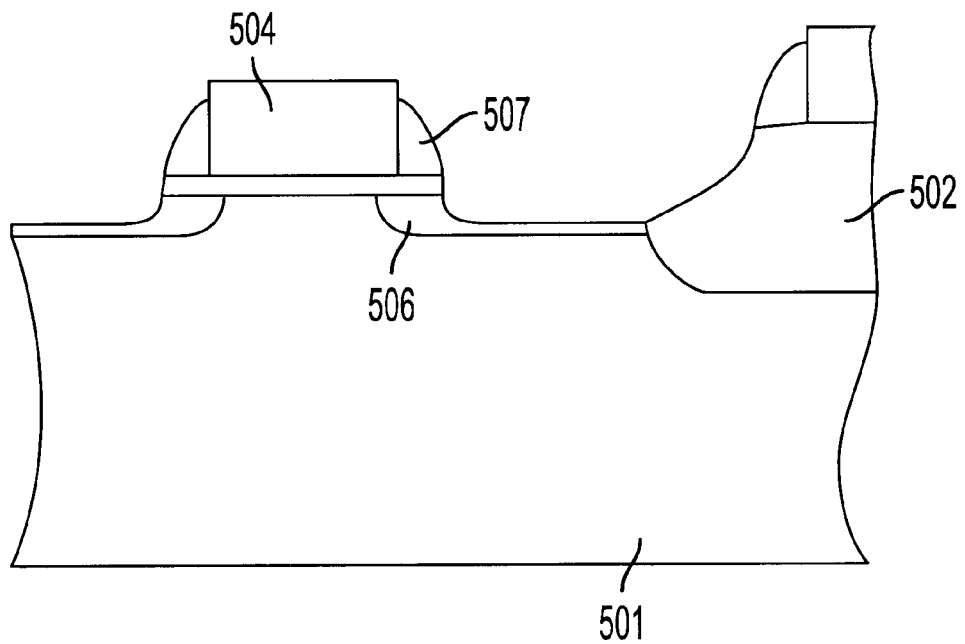
FIG. 5 is a cross-sectional view illustrating the memory cell portion just after the formation of side walls in accordance with the conventional fabrication process.

FIG. 1(a) indicates just the same state as FIG. 2(a). Described specifically, a field insulation layer 102 and a gate insulation layer 103 are formed on a P-type semiconductor substrate 101 by the LOCOS method and all over the surface, a polysilicon layer 104 for a gate electrode is laid.

A photoresist layer 105 is then formed by the light exposure technique, whereby a gate electrode 104a is formed for the peripheral circuit region and at the same time, in the memory cell N-channel transistor region, the polysilicon layer 104 is allowed to remain so that it covers and embraces not only the gate electrode but also source and drain regions [FIG. 1 (b)].

The photoresist 105 is then removed, followed by the introduction of phosphorus in an amount of $2 \times 10^{13}$ cm$^{-2}$ all over the surface by the ion implantation method. At this time, in the N-channel MOSFET source and drain regions in the peripheral circuit region, n$^-$ impurity diffusion layer 106 is formed in alignment with the gate electrode 104 [FIG. 1(c)].

Figure 1D:
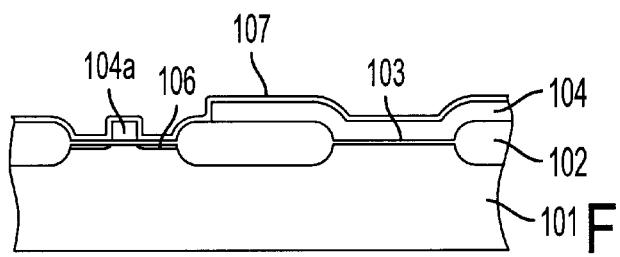
Figure 1E:
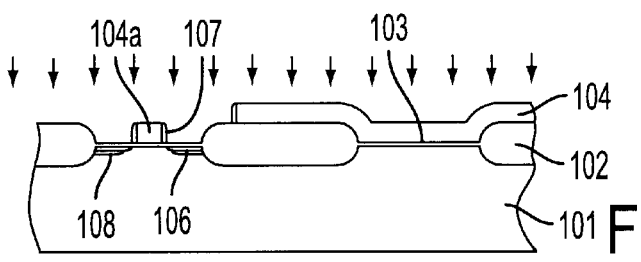
Figure 1F:
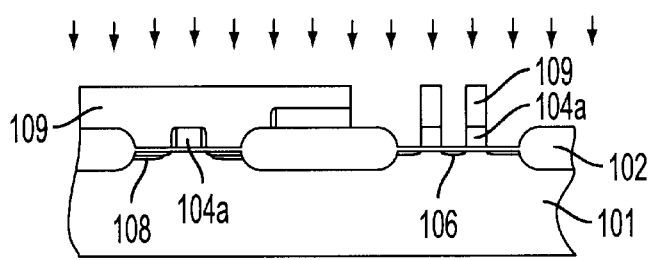

In a similar manner to the above-described conventional example, an insulation film 107 for the formation of side walls is allowed to grow all over the surface by the CVD method [FIG. 1(d)] and then side walls 107 are formed by the anisotropic dry etching method [FIG. 1(e)]. When a P-channel type MOSFET is disposed on the peripheral circuit region, it may be formed either simultaneously with the side walls, or as described in Japanese Patent Application Laid-Open No. 259400/1993 it may be formed separately. Incidentally, at this time, the surface of the substrate in the memory cell region is protected with a polysilicon layer 104 for the gate electrode.

With gate electrode 104a, side walls 107, polysilicon layer 104 for gate electrode and field insulation layer 102 as masks, As is introduced at a concentration as high as $3 \times 10^{15}$ cm$^{-2}$ by the ion implantation method, whereby n$^+$ impurity diffusion layer 108 is formed [FIG. 1(e)].

A photoresist 109 is then formed by the light exposure technique, followed by the formation of a gate electrode 104a for the memory cell region by the dry etching. Phosphorus is then introduced in an amount of $2 \times 10^{13}$ cm$^{-2}$ by the ion implantation method, whereby source and drain regions for the N-channel type MOSFET constituting the memory cell are formed [FIG. 1(f)]. At this stage, a side-wall free MOSFET is formed in the memory cell region, which makes it possible to form a desired MOSFET without exposing the source and drain region during the side wall forming step. The subsequent steps are effected in utterly the same manner to the above-described conventional example.

What is claimed is:

1. A method for preparing a semiconductor device comprising the steps of:
   (a) forming a gate insulation layer and a gate conductive layer in an active region on a surface of one conductivity type semiconductor substrate;
   (b) selectively removing said gate conductive layer to form a gate electrode for a first MOSFET group of one conductivity type in a peripheral circuit region while leaving a gate conductive layer portion corresponding to a second MOSFET group of one conductivity type in a memory cell region;
   (c) forming an insulation layer for the formation of sidewalls on a whole surface of said gate conductive layer portion, of said peripheral circuit region, and of said gate electrode;
   (d) etching back the insulation layer to form a side wall on each side of said gate electrode in the peripheral circuit region while protecting a surface of said semiconductor substrate in the memory cell region by said gate conductive layer portion; and
   (e) selectively removing the remaining gate conductive layer portion to form a gate electrode for the second MOSFET group of one conductivity type in the memory cell region, said gate electrode for said second MOSFET group having no side walls;
   wherein the semiconductor device comprises a pattern having a dense region and a sparse region in the same layer, and the pattern formation is carried out separately in the dense region and the sparse region.

2. The method for preparing semiconductor device according to claim 1, wherein the second MOSFET group is of one conductivity type and is a MOSFET constituting a memory cell.

3. The method for preparing a semiconductor device according to claim 1, wherein the pattern is a gate pattern.

4. The method for preparing a semiconductor device according to claim 3, wherein the pattern of the dense region constitutes a memory cell.

5. A method for preparing a semiconductor device having a memory region and a peripheral circuit region comprising the steps of:
   (a) forming a gate insulation layer and a conductive layer in the memory region and the peripheral circuit region on a surface of semiconductor substrate;
   (b) forming a photoresist layer on the whole surface, and patterning the conductive layer in the peripheral circuit region by a photolithography technique to form a gate electrode for a first transistor group in the peripheral circuit region, while leaving a conductive layer portion for the formation of a gate electrode of a second transistor group in the memory region such that the conductive layer portion covers source and drain regions for the second transistor group;
   (c) after removing the photoresist layer, ion-implanting into the peripheral circuit region and the remaining conductive layer portion in the memory region using the gate electrode in the peripheral circuit region and the remaining conductive layer portion in the memory region as a mask;
   (d) forming an insulation layer for the formation of side walls on a whole surface of said remaining conductive layer portion, of said gate electrode, and of said peripheral circuit region;
   (e) etching back the insulation layer to form a side wall on each side of the gate electrode in the peripheral circuit region, while removing the insulation layer on the remaining conductive layer portion in the memory region;
   (f) ion-implanting into the peripheral circuit region and the remaining conductive layer portion in the memory region using the gate electrode and the side walls in the peripheral circuit region and the remaining conductive layer portion in the memory region as a mask;
   (g) patterning the remaining conductive layer portion in the memory region to form a gate electrode for the second transistor group, said gate electrode for the second transistor group having no side walls; and
   (h) ion-implanting into the memory region with the peripheral circuit region masked.

* * * * *